United States Patent
Cheng et al.

(10) Patent No.: US 12,325,913 B2
(45) Date of Patent: Jun. 10, 2025

(54) DEFLECTOR FOR CHAMBER CLEANING

(71) Applicant: Taiwan Semiconductor Manufacturing Company, Ltd., Hsinchu (TW)

(72) Inventors: Kuang-Wei Cheng, Hsinchu (TW); Sung-Ju Huang, Taipei (TW); Yung-Tsun Liu, Taipei (TW); Chih-Tsung Lee, Hsinchu (TW); Chyi-Tsong Ni, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 575 days.

(21) Appl. No.: 17/671,966

(22) Filed: Feb. 15, 2022

(65) Prior Publication Data
US 2023/0257875 A1 Aug. 17, 2023

(51) Int. Cl.
*C23C 16/44* (2006.01)
*B08B 9/08* (2006.01)
(Continued)

(52) U.S. Cl.
CPC ............ *C23C 16/4405* (2013.01); *B08B 9/08* (2013.01); *C23C 16/325* (2013.01);
(Continued)

(58) Field of Classification Search
CPC ............ H01L 21/0228; C23C 16/4405; C23C 16/45525
See application file for complete search history.

(56) References Cited

U.S. PATENT DOCUMENTS 5,788,799 A    8/1998  Steger et al.
2014/0353734 A1*  12/2014  Xie ................... H01L 21/28088
                                                           257/288
(Continued)

FOREIGN PATENT DOCUMENTS

CN        101191200 A     6/2008
CN        112077067 A     12/2020
(Continued)

OTHER PUBLICATIONS

Chinese Office Action for Application No. 202210426613.6 Dated Mar. 1, 2025.

*Primary Examiner* — Hsien Ming Lee
(74) *Attorney, Agent, or Firm* — Lippes Mathias LLP

(57) ABSTRACT

A method of fabricating semiconductor devices includes: loading one or more semiconductor wafers into a plurality of stations provided within a process chamber; applying a process to the semiconductor wafers which deposits a material on the one or more semiconductor wafers within the process chamber; and cleaning the process chamber. Suitably, cleaning the process chamber includes flowing a cleaning gas into the process chamber toward a deflector arranged in the process chamber, the deflector having a first surface upon which the flowed cleaning gas impinges, the first surface directing a first portion of the flowed cleaning gas impinging thereon in a first trajectory toward a first end of the process chamber and directing a second portion of the flowed cleaning gas impinging thereon in a second trajectory toward a second end of the process chamber, the second end being opposite the first end.

20 Claims, 10 Drawing Sheets

(51) Int. Cl.
*C23C 16/32* (2006.01)
*C23C 16/40* (2006.01)
*C23C 16/455* (2006.01)
*H01L 21/02* (2006.01)

(52) U.S. Cl.
CPC ...... *C23C 16/401* (2013.01); *C23C 16/45525* (2013.01); *H01L 21/02126* (2013.01); *H01L 21/0228* (2013.01); *B08B 2209/08* (2013.01)

(56) References Cited

U.S. PATENT DOCUMENTS

2015/0030766 A1* 1/2015 Lind .................. C23C 16/4412 137/561 A
2019/0376183 A1* 12/2019 Shanbhag ......... C23C 16/45565

FOREIGN PATENT DOCUMENTS

| KR | 20150098456 A | 8/2015 |
| KR | 20170089288 A | 8/2017 |
| TW | 201001598 A | 1/2010 |
| TW | 202133317 A | 9/2021 |
| TW | 202143370 A | 11/2021 |

* cited by examiner

DEFLECTOR FOR CHAMBER CLEANING

BACKGROUND

The following relates to the semiconductor arts, and in particular, to a method and apparatus for use in the manufacture of semiconductor devices and/or the processing of semiconductor wafers; to the cleaning of process chambers used to deposit silicon-carbon-oxide (SiCO) materials; and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

FIG. 6A shows a perspective view of the deflector with a portion thereof cut away along the cross-section line A-A, FIG. 6B shows a perspective view of the deflector with a portion thereof cut away along the cross-section line B-B, FIG. 6C shows a perspective view of the deflector with a portion thereof cut away along the cross-section line C-C, and FIG. 6D shows a perspective view of the deflector with a portion thereof cut away along the cross-section line D-D

DETAILED DESCRIPTION

Figure 1A:
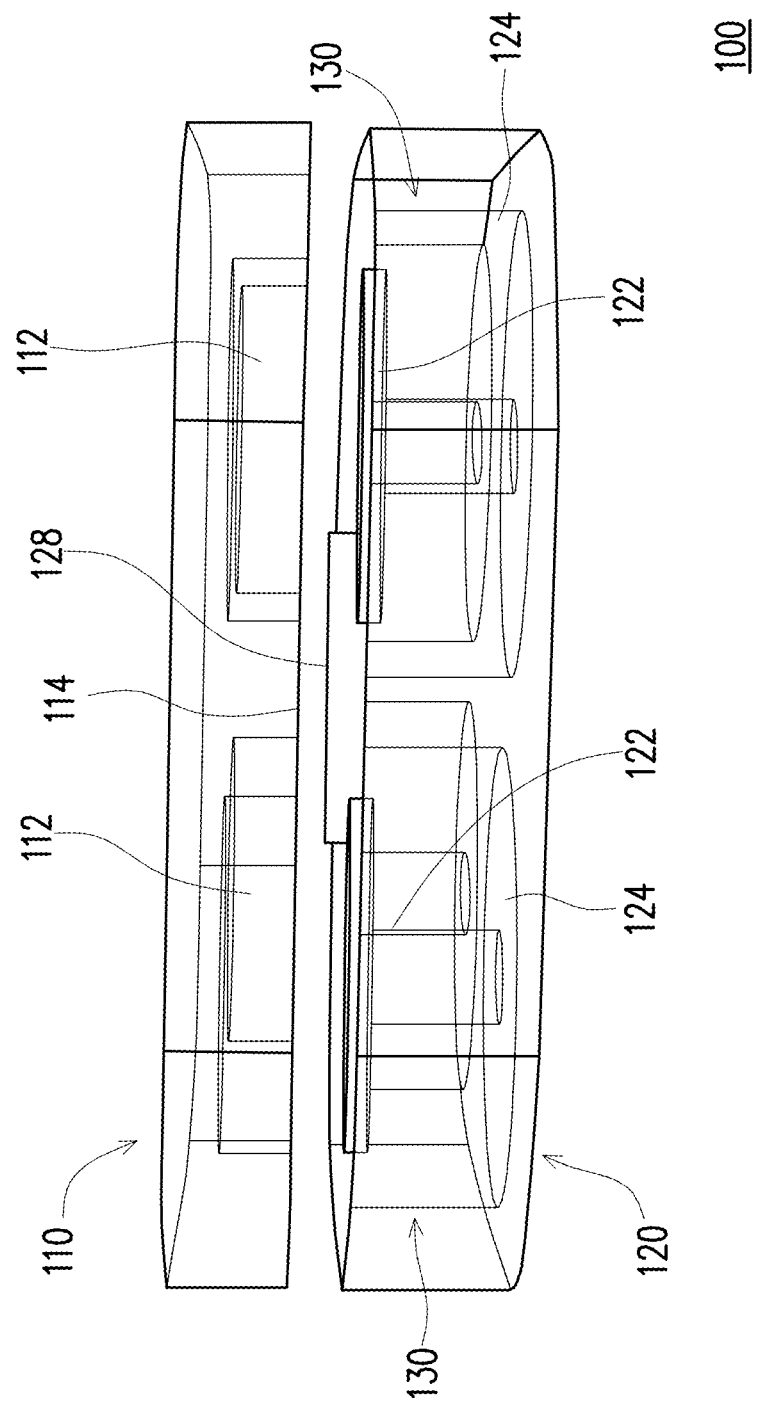
FIGS. 1A and 1B diagrammatically illustrate a partially blown apart side view and perspective view, respectively, of a multi-station process chamber for performing atomic layer deposition (ALD) or other like material deposition processing on semiconductor wafers or substrates in accordance with some embodiments disclosed herein, where certain elements and/or surfaces thereof are shown partially transparent to reveal interior structures and/or surfaces.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, semiconductor devices, for example, such as Metal-Oxide-Semiconductor Field-Effect Transistor (MOSFET) devices, Fin Field-Effect Transistor (FinFET) devices, Gate All Around Field-Effect Transistor (GAA-FET) devices, Integrated Circuits (ICs), etc. are manufactured and/or fabricated from and/or on semiconductor wafers and/or suitable substrates in a semiconductor fabrication plant, commonly referred to as a FAB or foundry. There are commonly many processing steps applied to the semiconductor wafer or substrate to produce a desired semiconductor device and/or numerous semiconductor devices on a wafer or suitable substrate. For example, semiconductor fabrication can be a multiple-step sequence of photolithographic, mechanical and/or chemical processing steps (for example, such as surface passivation, thermal oxidation, planar diffusion, junction isolation, etc.) during which electronic circuits and/or semiconductor devices are gradually created on the semiconductor wafer. Accordingly, a FAB clean room or other like space where fabrication takes place typically contains many individual pieces of machinery and/or tools for semiconductor device production, for example, without limitation, such as steppers and/or scanners for photolithography, in addition to tools for material deposition, etching, cleaning, doping, testing, inspecting, etc. and load ports or the like for temporary staging and/or storage of semiconductor wafers. During the fabrication process, a semiconductor wafer is commonly transported from tool to tool and/or otherwise transferred to and/or from processing and/or holding chambers of various tools and/or equipment with a robotic arm or the like, for example, of an Equipment Front End Module (EFEM).

Semiconductor manufacturing processes typically involve or include process steps in which various layers and/or thin films of material are built-up one upon another and optionally suitably patterned. A number of different material deposition methods and/or processes are available to produce material layers and/or thin films suitable for semiconductor fabrication, for example, such as chemical vapor deposition (CVD), atomic layer deposition (ALD), molecular layer deposition (MLD), etc. One or more material deposition process steps carried out in semiconductor manufacturing are generally performed in suitable process chambers.

For example, during ALD a layer or thin film of material may be deposited or grown on a substrate or semiconductor wafer within a process chamber by alternately exposing its surface to one or more precursors or reactants introduced into the process chamber. Suitably, the various precursors or reagents are not introduced or present simultaneously, but rather they are introduced in a sequential series of steps. In each of these steps, the precursor atoms or molecules may react with the surface in a self-limiting way, for example, so that the reaction terminates once all the reactive sites on the surface are filled or consumed. Consequently, the amount of material deposited on the surface after a single exposure is determined by the nature of the precursor and surface interaction. Advantageously, by varying the number of cycles, it is possible to grow materials uniformly and with high precision on complex and/or large substrates and/or semiconductor wafers. As a specific example, deposition of silicon carbon oxide (SiCO) of various stoichiometric ratios can be done by ALD or another deposition technique, and is an important part of many IC fabrication workflows.

In accordance with some suitable embodiments, a process chamber suitable for conducting ALD or other like material deposition processes of SiCO or other material is disclosed herein with multiple stations so that multiple semiconductor wafers and/or suitable substrates can be processed simultaneously within the multi-station process chamber. One advantage to having multiple stations in the process chamber is that the overall manufacturing process through-put can be increased, for example, as compared to a process chamber having only a single station for processing a single semiconductor wafer at a time. In a suitable embodiment disclosed herein, the process chamber includes four stations for processing up to four semiconductor wafers and/or suitable substrates simultaneously.

As a result of one or more repeated material deposition process steps, for example, such as ALD, being carried out within the process chamber, the process chamber may become dirty over time. That is to say, unwanted particles, debris and/or contaminates may be created, introduced, built-up and/or retained in the process chamber, for example, on various interior surfaces and/or components within the process chamber. In the specific example of SiCO deposition processes, carbon or carbon-based particles and/or contamination are typically produced. The presence of such unwanted particles and/or contamination within the process chamber can potentially interfere with subsequent material depositions and/or layer or thin film formation, for example, when the unwanted particles and/or contaminates land on or otherwise interfere with the surface of the semiconductor wafer being processed within the process chamber or the layer or thin film being formed thereon, resulting in damage to and/or defects occurring in the semiconductor wafer and/or the semiconductor devices being created. Accordingly, in some suitable embodiments disclosed herein, a cleaning process step may be carried out periodically or intermittently within the process chamber, for example, between material deposition process steps carried out in the process chamber. Advantageously, cleaning the process chamber as disclosed herein removes, eliminates or otherwise reduces unwanted particles and/or contaminates within the process chamber or otherwise neutralizes or inhibits the same from interfering with material deposition and/or layer or thin film formation on the semiconductor wafer or substrate. Accordingly, damage to and/or defects in the semiconductor wafer and/or semiconductor devices being built-up thereon can be avoided, limited or reduced. In some embodiments disclosed herein, the cleaning process may include flowing a cleaning gas, for example, into and/or through the process chamber. In some suitable embodiments for cleaning a SiCO deposition chamber, the cleaning gas may comprise a nitrogen trifluoride ($NF_3$).

However, frequent cleanings and/or the length of time each cleaning takes may potentially have a negative impact on the overall semiconductor manufacturing through-put through the process chamber. Accordingly, in some suitable embodiments disclosed herein, the process chamber, for example, a multi-station ALD process chamber, is equipped and/or fitted with a cleaning gas flow deflector that enhances the efficiency and/or effectiveness of the cleaning process. Advantageously, in some suitable embodiments, the deflector as disclosed herein allows effective cleanings of the process chamber to be performed less frequently and/or in shorter time periods, for example, as compared to when no such deflector (or a flat cover plate) is utilized, thereby increasing the overall manufacturing through-put through the process chamber. At least in part, this advantage is achieved or otherwise realized by the deflector effectively and/or efficiently directing the cleaning gas in directions and/or along trajectories toward multiple different regions within the process chamber. For example, in some suitable embodiments, the deflector is formed with a surface having a plurality of different areas or regions, some of which deflect or direct the flow of cleaning gas impinging thereon back along a trajectory or otherwise toward a first end of the process chamber (for example, an end of the process chamber from which the cleaning gas is introduced, such as the top end of the process chamber), while others deflect or direct the flow of cleaning gas impinging thereon along a trajectory or otherwise toward a second end of the process chamber (for example, an end opposite of that from which the cleaning gas is introduced, such as the bottom end of the process chamber).

Figure 1B:
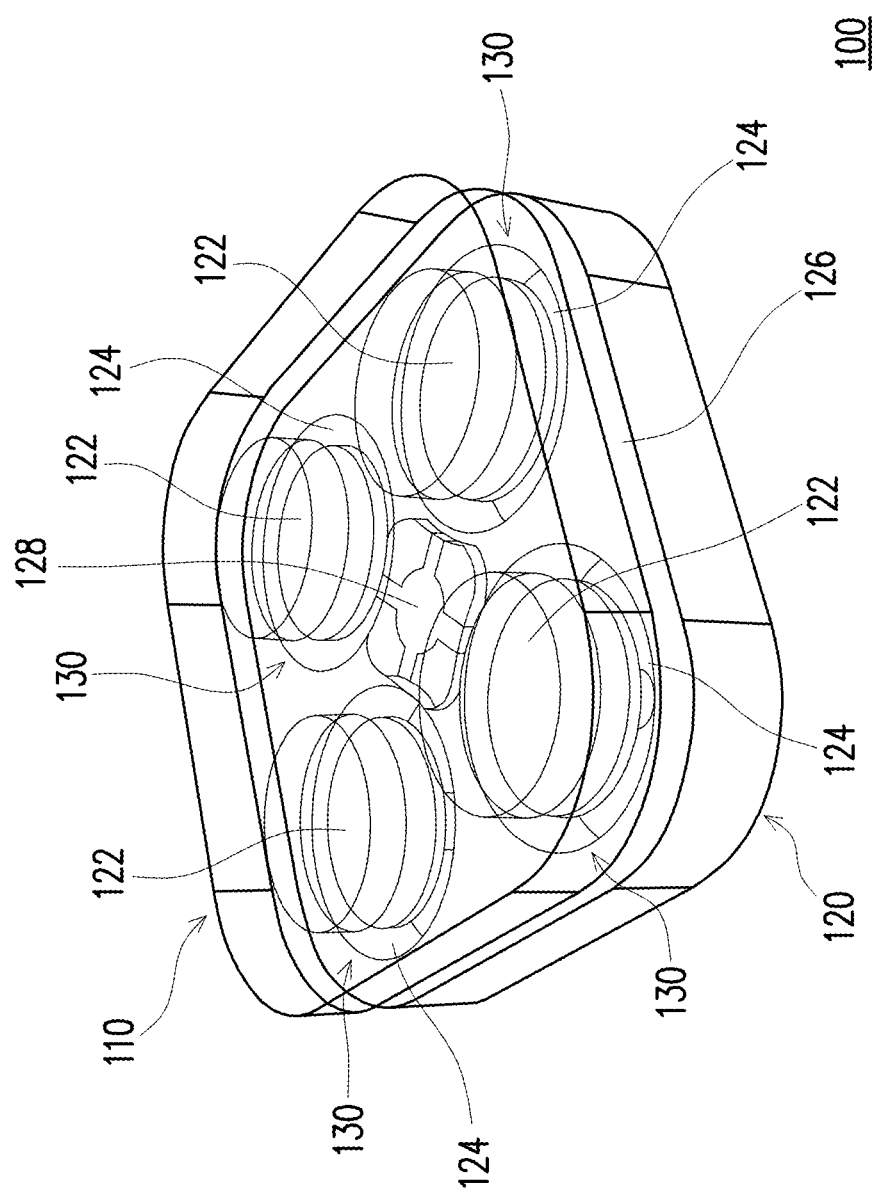

FIGS. 1A and 1B show a multi-station process chamber 100 according to some embodiments disclosed herein, for example, suitable for ALD and/or other like material deposition processing to form a layer of material and/or thin film on a semiconductor wafer or suitable substrate in connection with semiconductor fabrication. In the illustrative embodiments, the layer or thin film of material formed on the semiconductor wafer or substrate may comprise a silicon carbon oxide (SiCO) of a chosen stoichiometry, although deposition of a silicon-based dielectric, or the like, is alternatively contemplated. The process chamber 100 as shown includes an upper or top end or portion 110 and a lower or bottom end or portion 120. As shown in the illustrated embodiment, the multi-station process chamber 100 includes four stations 130, each station 130 arranged and/or otherwise configured to process a semiconductor wafer or suitable substrate placed, loaded and/or otherwise situated therein. In some alternative embodiments, more or less than four stations 130 may in practice be provided in the multi-station process chamber 100.

In practice, provisioned, arranged and/or situated, for example, in the lower or bottom end or portion 120 of the process chamber 100, each station 130 within the process chamber 100 may include a pedestal, stage or other mounting structure 122 upon which a semiconductor wafer or suitable substrate is selectively loaded, placed, secured and/or held. In some suitable embodiments, the mounting structure 122 may include a chuck, for example, a vacuum or electrostatic chuck, or other like holding device which selectively secures a semiconductor wafer or suitable substrate placed upon the mounting structure 122 thereto so as to selectively hold the semiconductor wafer or suitable substrate essentially stuck to the mounting structure 122.

In some suitable embodiments, each mounting structure 122 and/or station 130 is further provisioned, equipped and/or otherwise in operative thermal communication with a heater or heating element. The heater or heating element selectively supplies and/or applies a suitable amount of heat to the semiconductor wafer or suitable substrate loaded atop the mounting structure 122 so as to raise and/or maintain the same to and/or at a desired operating temperature appropriate for the material deposition process, for example, ALD, being carried out in the process chamber 100. For example, in some suitable embodiments, the operating temperature may be in a range of about room temperature or about 20 degrees Celsius to about 560 degrees Celsius.

In some suitable embodiments, each individual heater or heating element associated with each individual mounting structure 122 and/or station 130 may be separately and/or independently operated and/or controlled. Accordingly, for example, should less than all the given stations 130 be loaded with a semiconductor wafer or substrate for whatever reason, the corresponding heaters or heating elements for those stations 130 not being utilized (i.e., those stations 130 not having a semiconductor wafer or suitable substrate loaded therein) may remain unused or unenergized during the ALD or other material deposition process being executed in the process chamber 100.

In some suitable alternative embodiments, a single heater or heating element may be provided for more than one of the stations 130 and/or mounting structures 122. That is to say, as opposed to each mounting structure 122 and/or station 130 having its own heater or heating element, a single heater or heating element may supply or apply the desired heat to multiple mounting structures 122 or multiple stations 130.

In some suitable embodiments, as shown, each mounting structure 122 may be arranged and/or otherwise situated in a corresponding well or recess 124 formed in the bottom or lower end or portion 120 of the process chamber 100.

In practice, provisioned, arranged and/or situated, for example, in the upper or top end or portion 110 of the process chamber 100, each station 130 within the process chamber 100 may include a shower head 112 or other like inlet port. In some suitable embodiments, each shower head 112 is aligned with (for example, over and/or above) the corresponding mounting structure 122 for that station 130. In accordance with an ALD or other like material deposition process being carried out in the process chamber 100, suitable precursors and/or reactants, for example, in a gas-phase, are selectively flowed and/or introduced into the process chamber 100 through the respective shower heads 112 or other like inlet ports. For example, in the case of SiCO deposition the reactants comprise silicon, carbon, and oxygen precursors delivered at relative ratios that (in combination with other SiCO deposition process parameters such as wafer temperature and gas flow rates) provides SiCO deposition of the desired stoichiometry.

In some suitable embodiments, each individual shower head 112 (and/or the flow or introduction of a precursor or reagent therefrom) associated with each individual mounting structure 122 and/or station 130 may be separately and/or independently operated and/or controlled, for example to deposit SiCO of the desired stoichiometry. Accordingly, for example, should less than all the given stations 130 be loaded with a semiconductor wafer or substrate for whatever reason, the corresponding shower heads 112 (and/or the flow or introduction of a precursor or reagent therefrom) for those stations 130 not being utilized (i.e., those stations 130 not having a semiconductor wafer or suitable substrate loaded therein) may remain unused (i.e., without a precursor or reagent being flowed or introduced therefrom) during the ALD or other material deposition process being executed in the process chamber 100.

In some suitable alternative embodiments, a single shower head 112 may be provided for more than one of the stations 130 and/or mounting structures 122. That is to say, as opposed to each mounting structure 122 and/or station 130 having its own shower head 112, a single shower head 112 may selectively supply a precursor or reagent for multiple stations 130.

In some suitable embodiments, as shown, each shower head 112 may be arranged and/or otherwise situated in or on a top wall or ceiling 114 of the upper or top end or portion 110 of the process chamber 100.

Suitably, a vacuum system is provided to selectively pump, pull or draw gases through and/or from the process chamber 100 and/or maintain a desired atmospheric pressure within the process chamber 100. For example, during the application of an ALD or other like material deposition step being performed in the process chamber 100, the vacuum system may be operated and/or controlled to help form or otherwise establish a desired flow of the precursor or reagent introduced into the process chamber 100 via the respective shower heads 112, such that a surface of the semiconductor wafer or other suitable substrate loaded into each respective station 130 is suitably exposed to the precursor or reagent. In some suitable embodiments, the vacuum system may further be employed, operated and/or controlled selectively to remove or purge gases from the process chamber 100, for example, at, after or near an end of the ALD or other like material deposition step or treatment being carried out in the process chamber 100.

In some suitable embodiments, the vacuum system is operatively coupled to and/or in fluid communication with each of the stations 130 of the process chamber 100, for example, in, at or near the respective wells or recesses 124 containing the respective mounting structures 122. In this way, the vacuum system may act and/or help to pull, draw and/or otherwise flow gases (such as the introduced precursor or reagent from the respective shower heads 112) over the semiconductor wafers or substrates held on the respective mounting structures 122, down through the wells or recesses 124 and out of the process chamber 100.

In some suitable embodiments, the vacuum system may be selectively engaged separately for each individual station 130 (for example, via respective separate and/or individually operable and/or controllable connections to each individual station 130) and/or each individual station 130 may be provided with its own separate vacuum system. Accordingly, for example, should less than all the given stations 130 be loaded with a semiconductor wafer or substrate for whatever reason, the vacuum system for those stations 130 not being utilized (i.e., those stations 130 not having a semiconductor wafer or suitable substrate loaded therein) may remain unengaged during the ALD or other material deposition process being executed in the process chamber 100. In some suitable alternative embodiments, a single vacuum system may be provided for and/or in operative fluid communication with more than one of the stations 130. That is to say, as opposed to each station 130 having its own vacuum system or an independently operated and/or controlled connection to a common vacuum system, a single vacuum system may be in operative fluid communication with and/or selectively engaged collectively for multiple stations 130.

Figure 2:
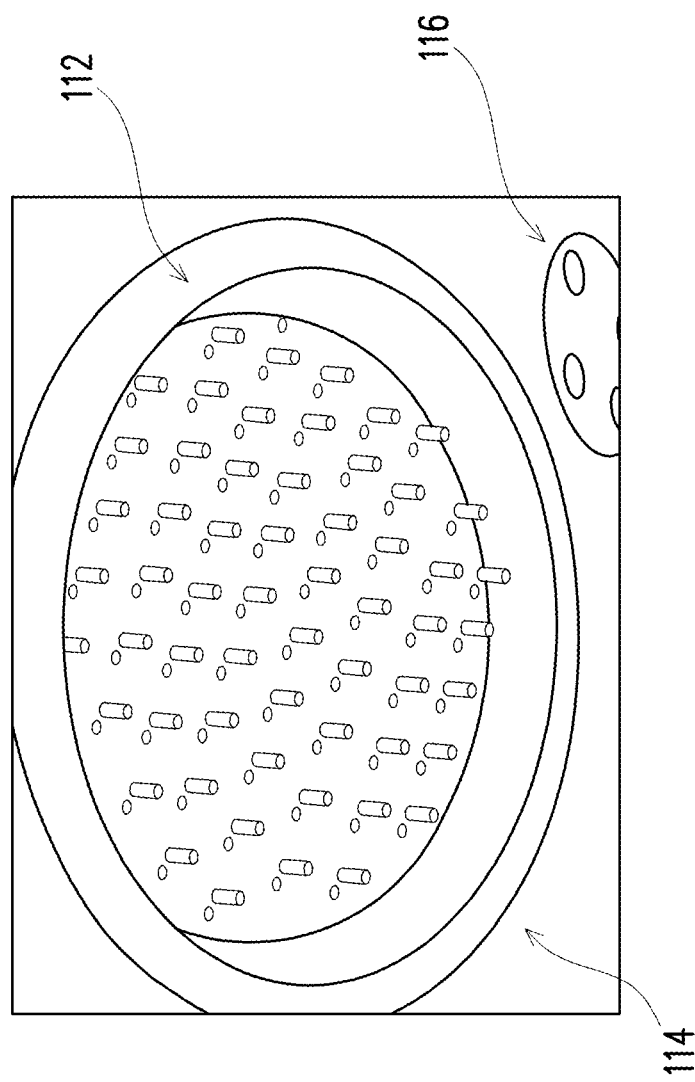
FIG. 2 diagrammatically illustrates a perspective view showing a portion of a ceiling of an upper or top end or portion of the process chamber shown in FIGS. 1A and 1B.

In some suitable embodiments, as seen for example in FIG. 2 which shows the outlet face of shower head 112, a cleaning gas inlet port 116 is that is separate from the shower head 112 provided for the process chamber 100. The gas inlet port 116 serves to admit the cleaning gas into the process chamber during the cleaning, and hence is referred to here as inlet port 116. The inlet port 116 can equivalently be viewed as the outlet of the cleaning gas feed line. As shown in FIGS. 1A and 1B, the stations 130 are arranged symmetrically in an essentially square two by two array or configuration within the process chamber 100. Suitably, the inlet port 116 is located in or on the top wall or ceiling 114 of the upper or top end or portion 110 of the process chamber 100, for example, centrally amid the two by two arrangement of shower heads 112 for the respective stations 130. More generally, if there are N stations 130 then they are suitably arranged in a configuration with N-fold rotational symmetry, e.g. the illustrative four stations 130 are arranged at 90° intervals (four-fold rotational symmetry), an alternative arrangement of five stations at 72° intervals could be used (five-fold symmetry); or an alternative arrangement of six stations at 60° intervals (six-fold symmetry); or an alternative arrangement of three stations at 120° intervals (three-fold symmetry); or so forth.

As mentioned above, in some suitable embodiments disclosed herein, a cleaning process step may be carried out periodically or intermittently within the process chamber 100, for example, in-between ALD and/or other like material deposition process steps carried out in the process chamber 100. In some embodiments disclosed herein, the cleaning process may include flowing a cleaning gas, for example, into and/or through the process chamber 100. In some suitable embodiments for a process chamber used for SiCO deposition, the cleaning gas may comprise a nitrogen trifluoride ($NF_3$) as a nonlimiting illustrative example. Suitably, the cleaning gas may be introduced and/or flowed into the process chamber 100 from the inlet port 116.

Figure 3:
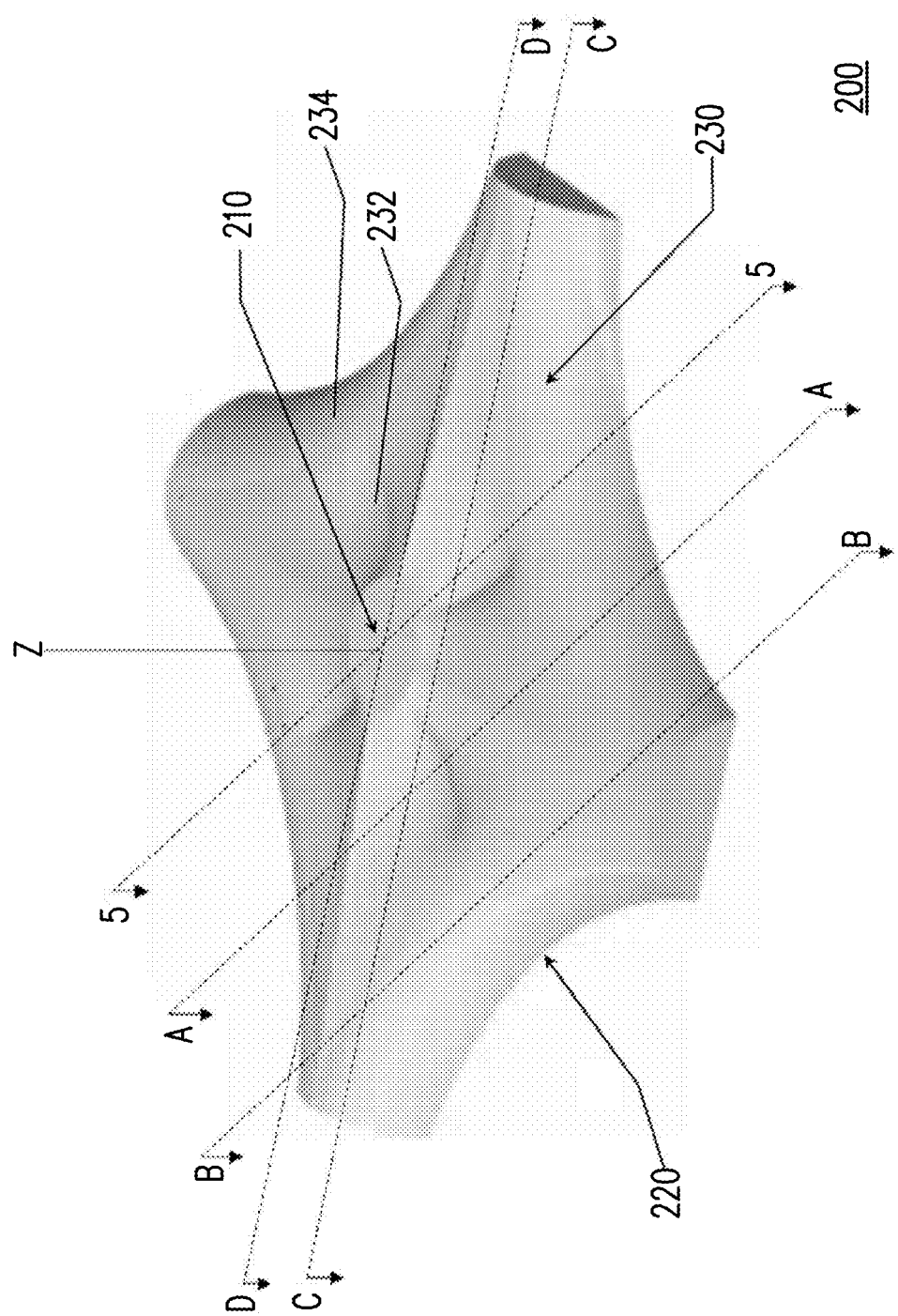
FIG. 3 diagrammatically illustrates a perspective view of a cleaning gas deflector in accordance with some embodiments disclosed herein.
Figure 4B:
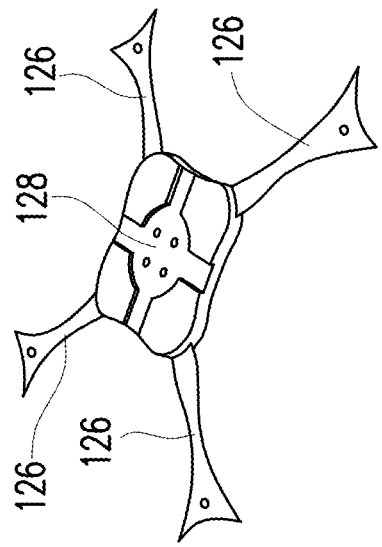
FIGS. 4A and 4B diagrammatically illustrate a partial perspective view showing a portion of a lower or bottom end or portion of the process chamber shown in FIGS. 1A and 1B including the spindle (FIG. 4A), and a perspective isolation view of the spindle (FIG. 4B).
Figure 4A:
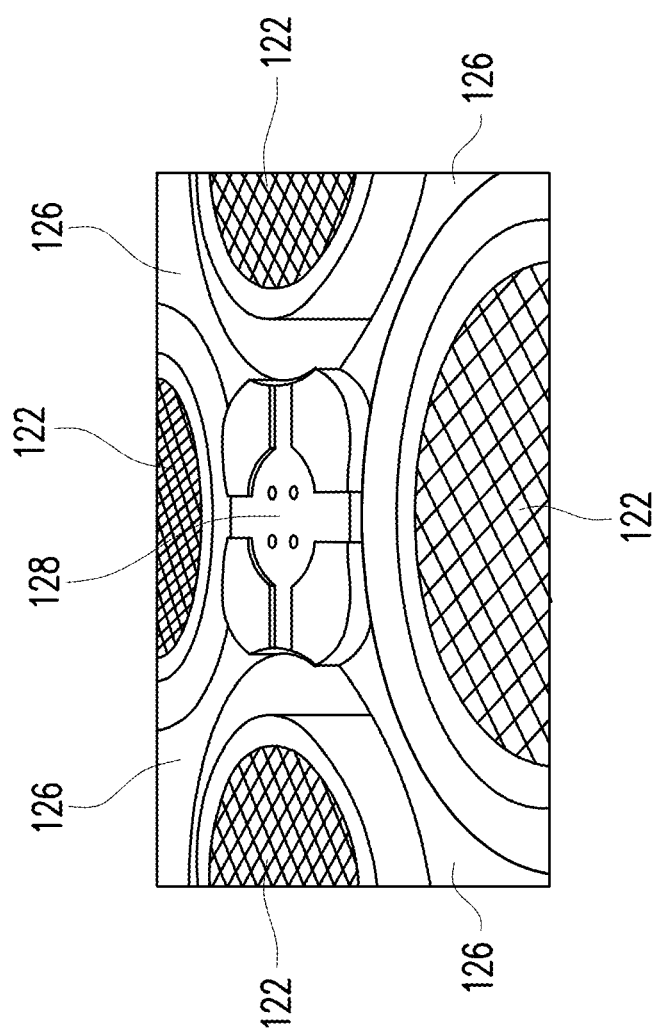

FIG. 3 shows a cleaning gas deflector 200. In some suitable embodiments, as seen for example in FIGS. 4A and 4B, the process chamber includes a spindle 125 (shown in isolation in FIG. 4B) that includes end effectors 126 that serve to lift or otherwise manipulate the wafers 122, and a central index plate 128 of the spindle. The index plate 128 is also shown in FIGS. 1A and 1B. For the illustrative design with four stations 130, there are four end effectors 126 as best seen in the isolation view of the spindle 125 shown in FIG. 4B. For other numbers of stations, the number of end effectors may be different, e.g. with five stations five end effectors may be provided. The cleaning gas deflector 200 may replace the index plate 128 of the spindle 125 of the bottom or lower end or portion 120 of the process chamber 100. Said another way, the deflector 200 suitably serves as or forms the index plate of the spindle 125. Thus, the deflector 200 is located, for example, centrally amid the two by two arrangement of mounting structures 122 for the respective stations 130. The cleaning gas deflector 200 has a curved upper surface as seen in FIG. 3 which is designed as disclosed herein to direct the distribution of the $NF_3$ or other cleaning gas during process chamber cleaning, especially upward toward the shower heads 112 of the respective stations 130. By comparison the index plate 128 has a flat upper surface which does not provide this advantageous direction of the cleaning gas distribution.

In some suitable embodiments, as shown in FIG. 3 for example, the deflector 200 has a central hub 210 and an outer periphery 220 between which a first surface extends 230. In some suitable embodiments, a central vertical axis (i.e., the illustrated Z axis) extends through the central hub 210 of the deflector, for example, substantially normal or perpendicular thereto. In some suitable embodiments, the deflector 200 is arranged within the process chamber 100 (for example, supported from the floor 126 of the bottom or lower end or portion 120 of the process chamber 100) such that, at the outer periphery 220 of the deflector 210, a second surface 240 of the deflector 200 (opposite the first surface 230) may be within a range of between greater than or equal to 0 mm and less than or equal to 30 mm from the floor 126 of the bottom or lower end or portion 120 of the process chamber 100.

In some embodiments, within the process chamber 100, the deflector 200 and the cleaning gas inlet port 116 are aligned with one another, for example, on and/or along the Z axis, so that the first surface 230 of the deflector 200 faces the inlet port 116. That is to say, within the process chamber 100, the cleaning gas inlet port 116 is essentially aligned over and/or above the deflector 200. Accordingly, the cleaning gas introduced and/or flowed into the process chamber 100 from the inlet port 116 is initially directed downward toward and/or in a direction of the first surface 230 of the deflector 200.

In some suitable embodiments, the surface 230 of the deflector 200 has a plurality of different areas or regions, some of which deflect or direct the flow of cleaning gas impinging thereon back along a trajectory or otherwise toward the upper or top end or portion 110 of the process chamber 100 (that is, the end of the process chamber 100 from which the cleaning gas is initially introduced via the inlet port 116), while others deflect or direct the flow of cleaning gas impinging thereon along a trajectory or otherwise toward the lower or bottom end or portion of 120 of the process chamber 100 (that is, the end opposite of that from which the cleaning gas is initially introduced via the inlet port 116). More specifically, in some embodiments, the first surface 230 of the deflector 200 may have: (i) one or more depressions 232 therein which are each defined at least in part by a first suitably parabolic arc which is concave up, and (ii) one or more ridges 234 therein which are each defined at least in part by a second suitably parabolic arc which is concave down. In practice, the depressions 232 may act or tend to deflect or direct the flow of cleaning gas impinging thereon back along a trajectory or otherwise toward the upper or top end or portion 110 of the process chamber 100, while the ridges 234 may act or tend to deflect or direct the flow of cleaning gas impinging thereon along a trajectory or otherwise toward the lower or bottom end or portion 120 of the process chamber 100. In this way, during execution of the cleaning process, the cleaning gas impinging on the first surface 230 of the deflector 200 is effectively and/or efficiently directed and/or distributed to both the upper or top end or portion 110 and the lower or bottom end or portion 120 of the process chamber 100 thereby resulting in a more effective and/or efficient cleaning of the entire process chamber 100. Hence, a cleaning frequency and/or cleaning duration can be limited accordingly, which in turn can result in a greater overall semiconductor manufacturing throughput through the process chamber 100, for example, as compared to when no such deflector 200 is used or present in the processing chamber 100.

Figure 5:
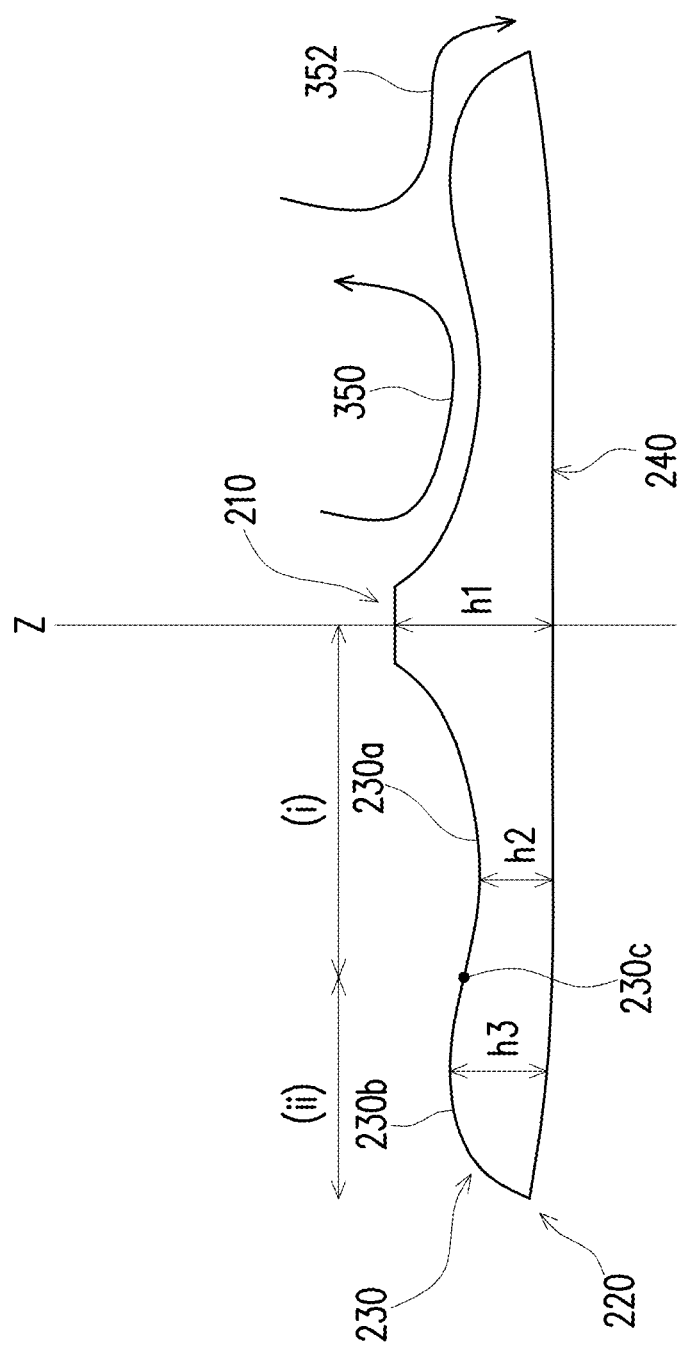
FIG. 5 diagrammatically illustrates a cross section view of the cleaning gas deflector shown in FIG. 3, taken along cross-section line 5-5.

In some suitable embodiments, as seen for example in FIG. 5, along a bisecting cross-section of the deflector 200 the first surface 230 is defined by at least two arcs 230a and 230b having an inflection point 230c therebetween. In some suitable embodiments, the first arc 230a (which at least partially defines one of the depressions 232) is concave in a first direction (for example, up) between the central hub 210 and the inflection point 230c; and the second arc 230b (which at least partially defines one of the ridges 234) is concave in a second direction (for example, down) between the inflection point 230c and the outer periphery 220, wherein the second direction is opposite the first direction.

In some suitable embodiments, the each of the arcs 230a and 230b may be parabolic. In some suitable embodiments, the first arc 230a may have a radius of curvature in a range of between greater than or equal to 20 mm and less than or equal to 500 mm, and the second arc 230b may have a radius of curvature in a range of between greater than or equal to 10 mm and less than or equal to 300 mm.

As shown, the deflector 200 has a second surface 240 opposite the first surface 230. A thickness of the deflector 200 at any given point is given by a distance (for example, measured in a direction of the Z axis) between the first surface 230 and the second surface 240. In some suitable embodiments, the deflector has a first thickness h1 at the central hub 210, a second thickness h2 at a localized minimum of the first arc 230a and a third thickness h3 at a localized maximum of the second arc 230b. In some suitable embodiments, the first thickness h1 is greater than the third thickness h3 and the third thickness h3 is greater than the second thickness h2.

As seen for example in FIG. 5, the first arc 230a extends a first distance i, measured along a radial direction normal to the central vertical axis Z, between the central hub 210 of the deflector 200 and the inflection point 230c; and the second arc 230b extends a second distance ii, likewise measured along the radial direction normal to the central vertical axis Z, between the inflection point 230c and the outer periphery 220 of the deflector 200. In some suitable embodiments, a ratio of the first distance i to the second distance ii (that is i/ii) may be in a range of between great than or equal to 1 and less than or equal to 5.

Figure 6A:
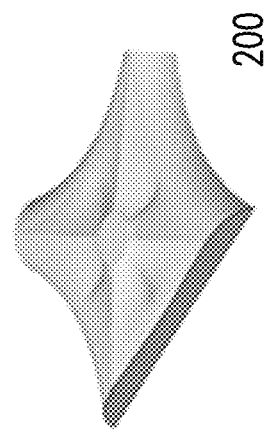
FIGS. 6A through 6D are diagrammatic illustrations showing various perspective views of the deflector shown in FIG. 3 with respective cut aways, taken along respective cross-section lines, removed therefrom. More specifically.
Figure 6B:
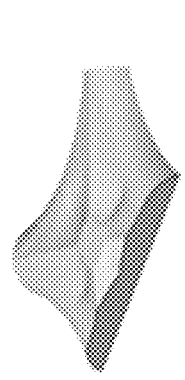
Figure 6C:
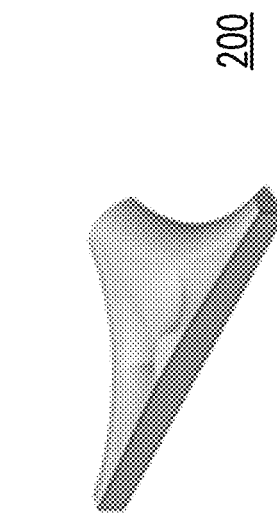
Figure 6D:
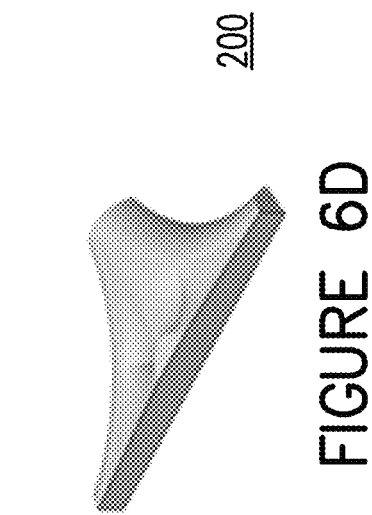

In some embodiments, an overall shape and/or contour of the surface 230 of the deflector 200 is defined and/or otherwise established by a suitable collection and/or combination of various ridges and depressions. To appreciate and/or illustrate a suitable shape and/or contours of the first surface 230 of the deflector 200 according to some suitable embodiments, FIGS. 6A through 6D show various perspective views of the deflector 200 with respective cut aways taken along respective cross-section lines removed therefrom. More specifically, FIG. 6A shows a perspective view of the deflector 200 with a portion thereof cut away along the cross-section line A-A, FIG. 6B shows a perspective view of the deflector 200 with a portion thereof cut away along the cross-section line B-B, FIG. 6C shows a perspective view of the deflector 200 with a portion thereof cut away along the cross-section line C-C, and FIG. 6D shows a perspective view of the deflector 200 with a portion thereof cut away along the cross-section line D-D. FIG. 5 shows a cross-section view of the deflector taken along the bisecting cross-section line 5-5. In some suitable embodiments, the surface 230 of the deflector 200 exhibits mirror symmetry with respect to the section line 5-5 and/or section line D-D and/or radial symmetry with respect to the vertical Z axis extending through the central hub 210 of the deflector 200.

Figure 7B:
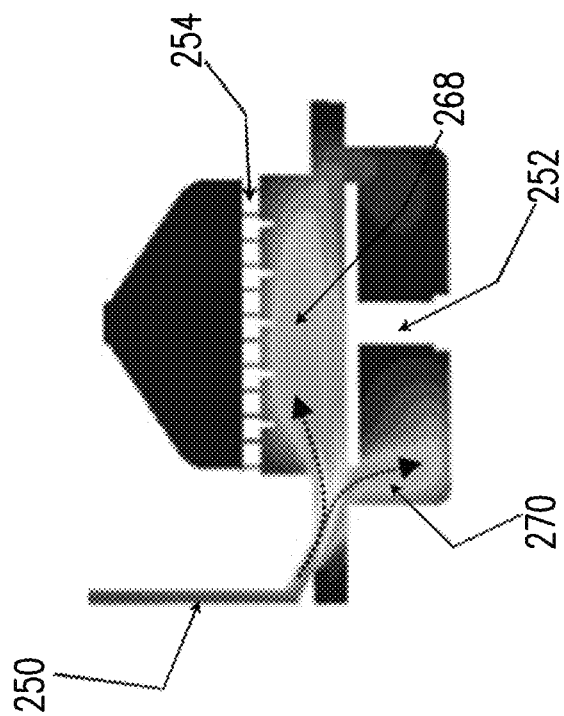
FIGS. 7A and 7B illustrate gas flow simulations for the cleaning gas flow during cleaning of a process chamber having a flat index plate (FIG. 7A) versus having a deflector plate (FIG. 7B).
Figure 7A:
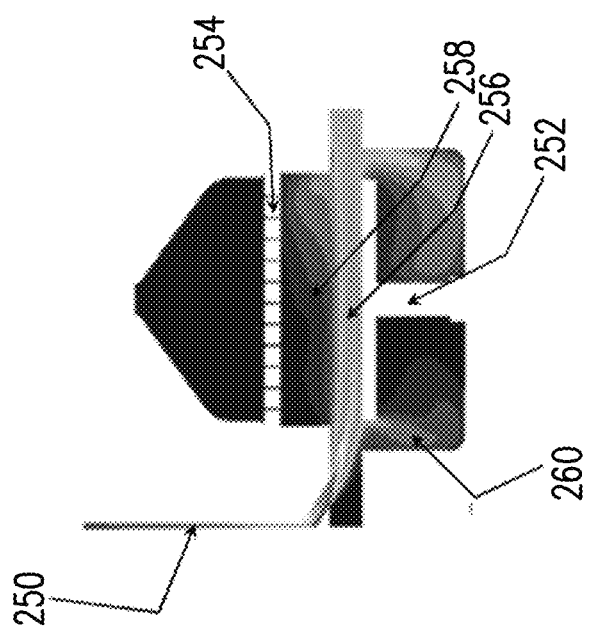

FIGS. 7A and 7B illustrate gas flow simulations for the cleaning gas flow during cleaning of a process chamber. FIG. 7A illustrates gas flow in a chamber having the flat index plate 128 (e.g., as shown in FIGS. 1A and 1B and FIGS. 4A and 4B). FIG. 7B illustrates gas flow in a chamber having the deflector 200 with the described curved upper surface substituted in place of index plate 128. In the illustrations of the flow simulations presented in FIGS. 7A and 7B, gas flow through a single station 130 is shown. Inlet cleaning gas flow 250 corresponds to the stream of cleaning gas entering the process chamber via the inlet port 116 (see FIG. 2). A gas-free area 252 corresponds to the volume occupied by the mounting structure 122 of the station 130, while gas-free areas 254 correspond to volume occupied by solid material of the shower head 112.

As seen in FIG. 7A, in the case of the process chamber having the flat index plate 128 the process gas distribution has a generally flat, horizontal high density region 256 corresponding to cleaning gas flowing over the upper surface of the mounting structure 122 (corresponding to gas-free area 252 of the gas flow simulations). On the other hand, a very low gas density 258 is present in the region proximate to (i.e. underneath) the shower head 112 (corresponding to gas free areas 254), and a low cleaning gas density 260 is also present in the well or recess 124 via which vacuum is drawn. Consequently, the shower head 112 and the well or recess 124 are not effectively cleaned by the NH$_3$ or other cleaning gas during the cleaning process, due to the respective low gas density regions 258 and 260.

By contrast, FIG. 7B illustrates the cleaning gas flow simulation in the case in which the deflector 200 is used. The effect of the deflector 200 is to deflect a large portion of the cleaning gas stream 250 upward toward the shower head 112, thus producing a high cleaning gas density 268 in the region proximate to (i.e. underneath) the shower head 112. This corresponds to the cleaning gas following the trajectory represented by the arrow 350 in FIG. 5 flowing back toward the upper or top end or portion 110 of the process chamber 100. The deflector 200 also operates to deflect another portion of the the cleaning gas stream 250 downward into the well or recess 124, thus forming a relatively high gas density region 270. This corresponds to the cleaning gas following the trajectory represented by the arrow 352 in FIG. 5 toward the lower or bottom end or portion of 120 of the process chamber 100. Consequently, the shower head 112 and the well or recess 124 are effectively cleaned by the NH$_3$ or other cleaning gas during the cleaning process when using the deflector 200, due to the respective high gas density regions 268 and 270 produced by the deflection of the cleaning gas stream 250 provided by the deflector plate 200.

Figure 8:
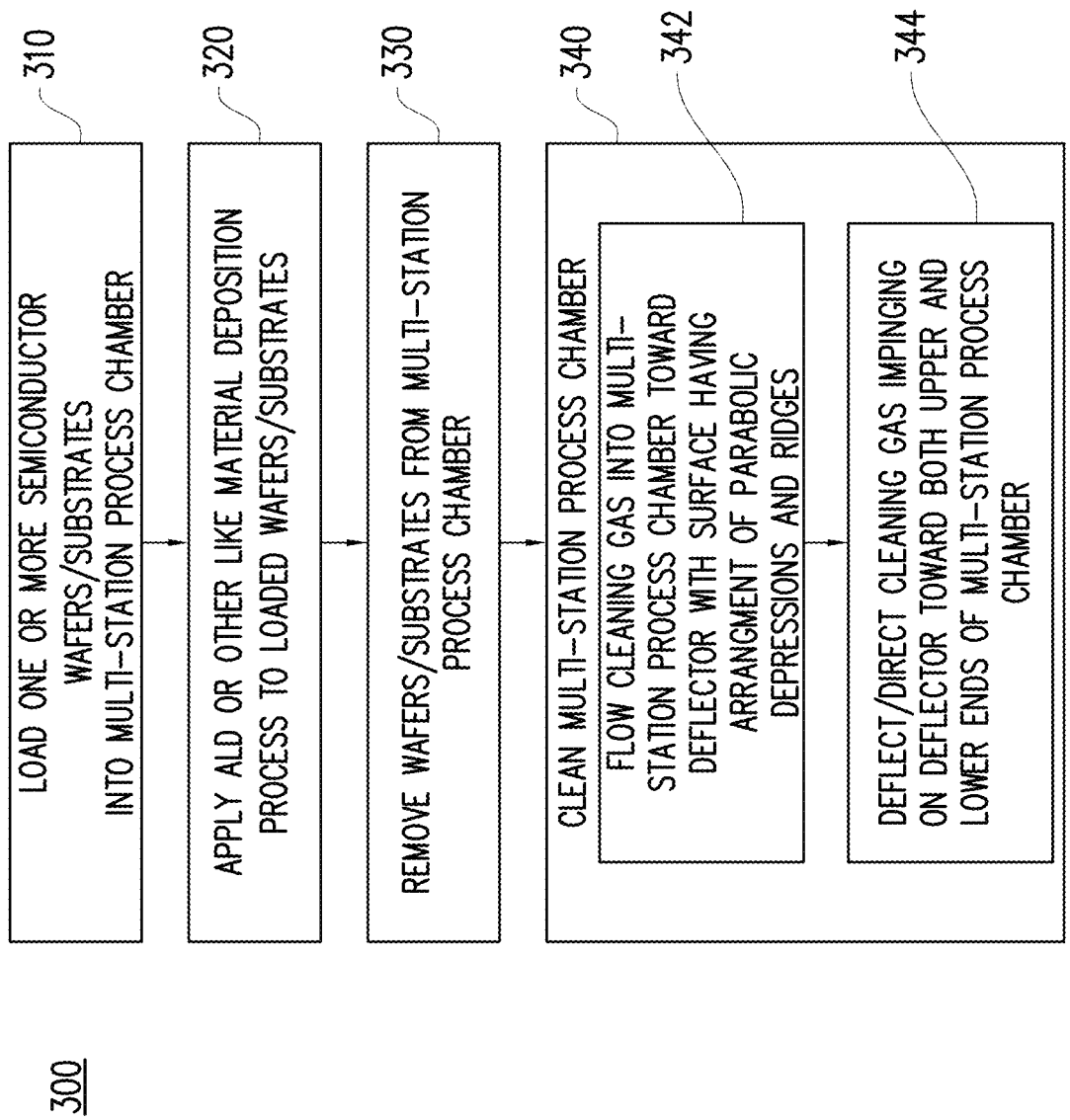
FIG. 8 is a flow chart showing a semiconductor processing method in accordance with some embodiments disclosed herein, for example, utilizing the processing chamber of FIGS. 1A and 1B having the deflector of FIG. 3 installed therein.

With reference now to FIG. 8, there is shown a flow chart illustrating a semiconductor manufacturing process 300 according to some embodiments disclosed herein, which employs, for example, the multi-station processing chamber 100 equipped with the deflector 200.

As shown, in step 310, one or more semiconductor wafers or suitable substrates are loaded into selected stations 130 of the processing chamber 100. For example, each loaded semiconductor wafer or substrate may be suitably placed atop and/or secured (for example, via the associated chuck) to a selected one of the mounting structures 122. For example, such loading may be performed with and/or aided by a robotic arm of an EFEM or the like.

In step 320, the loaded semiconductor wafers within the process chamber 100 are subjected to a material deposition process, for example, ALD, to form a material layer or thin film on the semiconductor wafers or substrates loaded in the respective stations 130 of the process chamber 100. In some embodiments, this is accomplished by introducing and/or flowing a gas-phase precursor or reagent into the process chamber 100 via the respective shower heads 112. In practice, during step 320, the loaded semiconductor wafers or substrates within each station 130 may be heated to and/or maintained at the desired operating temperature by the heaters or heating elements provided for the respective mounting structures 122 and/or stations 130. Additionally, during step 320, the vacuum system may be suitably operated and/or controlled to produce or otherwise aid in forming a desired flow of the gaseous precursor or reagent through the process chamber 100 such that a surface of the loaded semiconductor wafers or substrates receives a desired exposure to the same. Suitably, after, at or near completion of step 320, the vacuum system may continue to be operated or used to or otherwise aid in purging or removing any remaining precursor or reagent or other gases or the like from the process chamber 100, and at step 330, the treated semiconductor wafers or substrates (having a newly formed material layer or thin film thereon) may in turn be unloaded from their stations 130 and/or otherwise removed from the process chamber 100, for example, with the respective chucks having been disengaged. In practice, steps 310 through 330 may optionally be repeated one or more times before processing to the cleaning step 340.

As shown at step 340, the process chamber 100 is periodically or intermittently cleaned or otherwise subjected to a cleaning process, for example, in-between cycles of steps 310 through 330.

In some suitable embodiments, as shown in sub-step 342, the cleaning process 340 includes introducing and/or initially flowing a cleaning gas (for example, such as $NF_3$) into the process chamber 100, for example, from the inlet port 116 toward the deflector 200. In some suitable embodiments, as shown in sub-step 344, upon impinging the deflector 200, the various depressions 134 and ridges 234 forming the surface 130 of the deflector 200 act or tend to deflect the impinging cleaning gas both (a) in a direction or trajectory (graphically represented for example by the arrow 350 in FIG. 5) back toward the upper or top end or portion 110 of the process chamber 100 (that is, the end of the process chamber 100 from which the cleaning gas is initially introduced via the inlet port 116), and (b) in a direction or trajectory (graphically represented for example by the arrow 352 in FIG. 5) toward the lower or bottom end or portion of 120 of the process chamber 100 (that is, the end opposite of that from which the cleaning gas is initially introduced via the inlet port 116). In this way, during execution of the cleaning process 340, the cleaning gas impinging on the first surface 230 of the deflector 200 is effectively and/or efficiently directed and/or distributed to both the upper or top end or portion 110 and the lower or bottom end or portion 120 of the process chamber 100 thereby resulting in a more effective and/or efficient cleaning of the entire process chamber 100. Hence, a cleaning frequency and/or cleaning duration can be limited accordingly, which in turn can result in a greater overall semiconductor manufacturing throughput through the process chamber 100, for example, as compared to when no such deflector 200 is used or present in the processing chamber 100 during the cleaning process.

In some suitable embodiments, during the cleaning process or step 340, the vacuum system may be suitably operated and/or controlled to produce or otherwise aid in forming a desired flow of the cleaning gas throughout the process chamber 100. Additionally, after, at or near completion of step 340, the vacuum system may continue to be operated or used to or otherwise aid in purging or removing any remaining cleaning or other gases or the like from the process chamber 100.

Figure 9:
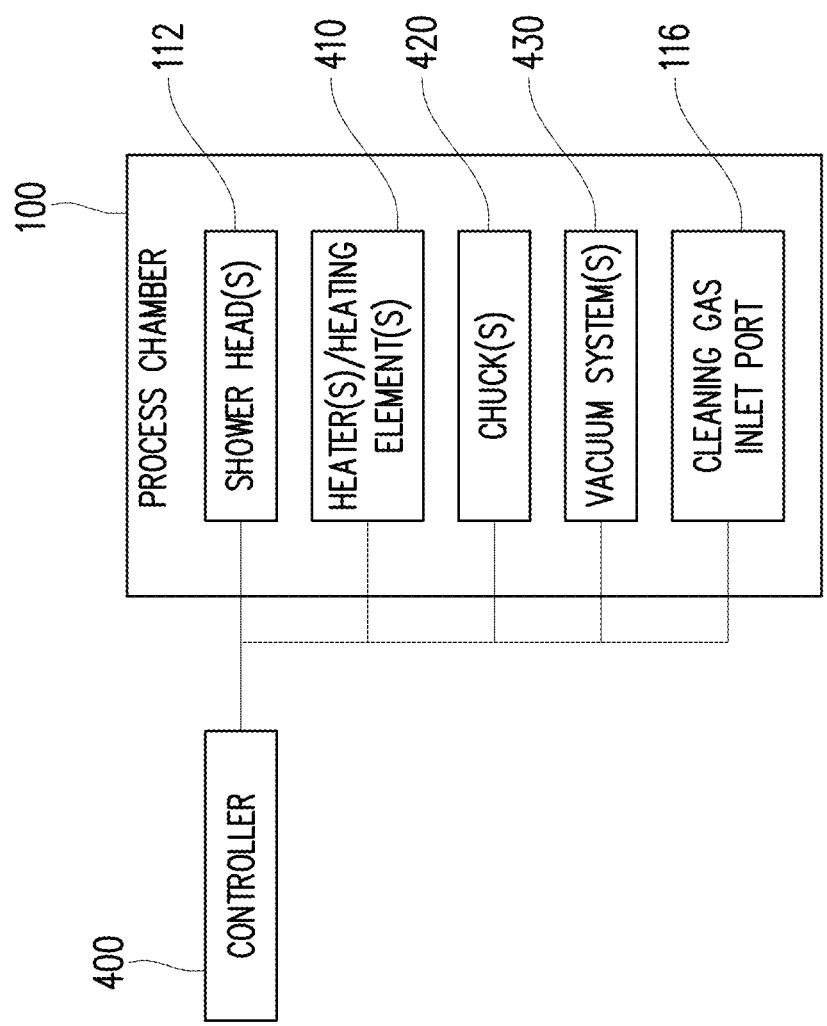
FIG. 9 diagrammatically illustrates a semiconductor processing system in accordance with some embodiments disclosed herein, for example, including the processing chamber of FIGS. 1A and 1B having the deflector of FIG. 3 installed therein.

With reference now to FIG. 9, in some embodiments, a suitable controller 400 may be implemented via hardware, software, firmware or an appropriate combination thereof to control, regulate and/or coordinate operation of the various elements and/or components described herein to achieve and/or carry out any one or more of the processes and/or steps described herein. For example, as shown, the controller 400 may regulate and/or control operation of, without limitation: the shower head(s) 112 and/or the introduction and/or flowing of precursors and/or reagents therefrom; the heater(s) or heating element(s) 410 provided for and/or associated with each station 130 or mounting structure 122; the chuck(s) 420 provided for and/or associated with each station 130 or mounting structure 122; the vacuum system(s) 430 provided for and/or associated with each station 130; and the cleaning gas inlet port 116 and/or the introduction and/or flowing of cleaning gas therefrom.

In particular, one or more controllers may be embodied by processors, electrical circuits, computers and/or other electronic data processing devices that are configured and/or otherwise provisioned to perform one or more of the tasks, steps, processes, methods and/or functions described herein. For example, a processor, computer, server or other electronic data processing device embodying a controller may be provided, supplied and/or programmed with a suitable listing of code (e.g., such as source code, interpretive code, object code, directly executable code, and so forth) or other like instructions or software or firmware, such that when run and/or executed by the computer or other electronic data processing device one or more of the tasks, steps, processes, methods and/or functions described herein are completed or otherwise performed. Suitably, the listing of code or other like instructions or software or firmware is implemented as and/or recorded, stored, contained or included in and/or on a non-transitory computer and/or machine readable storage medium or media so as to be providable to and/or executable by the computer or other electronic data processing device. For example, suitable storage mediums and/or media can include but are not limited to: floppy disks, flexible disks, hard disks, magnetic tape, or any other magnetic storage medium or media, CD-ROM, DVD, optical disks, or any other optical medium or media, a RAM, a ROM, a PROM, an EPROM, a FLASH-EPROM, or other memory or chip or cartridge, or any other tangible medium or media from which a computer or machine or electronic data processing device can read and use. In essence, as used herein, non-transitory computer-readable and/or machine-readable mediums and/or media comprise all computer-readable and/or machine-readable mediums and/or media except for a transitory, propagating signal.

In general, any one or more of the particular tasks, steps, processes, methods, functions, elements and/or components described herein may be implemented on and/or embodiment in one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the respective tasks, steps, processes, methods and/or functions described herein can be used.

In the following, some further illustrative embodiments are described.

In some embodiments, a method of fabricating semiconductor devices is provided. The method includes: loading one or more semiconductor wafers into a plurality of stations provided within a process chamber; applying a process to the semiconductor wafers which deposits a material on the one or more semiconductor wafers within the process chamber; and cleaning the process chamber. Suitably, cleaning the process chamber includes flowing a cleaning gas into the process chamber toward a deflector arranged in the process chamber, the deflector having a first surface upon which the flowed cleaning gas impinges, the first surface directing a first portion of the flowed cleaning gas impinging thereon in a first trajectory toward a first end of the process chamber and directing a second portion of the flowed cleaning gas impinging thereon in a second trajectory toward a second end of the process chamber, the second end being opposite the first end.

In some further embodiments, the material comprises a silicon carbon oxide (SiCO).

In still additional embodiments, the deflector has a central hub and an outer periphery between which the first surface extends, and along a bisecting cross-section of the deflector the first surface is defined by at least two arcs having an inflection point therebetween, the at least two arcs including a first arc which is concave in a first direction between the central hub and the inflection point and a second arc which is concave in a second direction between the inflection point and the outer periphery, the second direction being opposite the first direction.

In some embodiments, the first and second arcs are parabolic.

In yet further embodiments, the first arc has a radius of curvature in a range of between greater than or equal to 20 mm and less than or equal to 500 mm, and the second arc has a radius of curvature in a range of between greater than or equal to 10 mm and less than or equal to 300 mm.

In some further embodiments, the deflector has a second surface opposite the first surface, such that a thickness of the deflector is given by a distance between the first and second surfaces, the deflector having a first thickness at the central hub, a second thickness at a localized minimum of the first arc and a third thickness at a localized maximum of the second arc, the first thickness being greater than the third thickness and the third thickness being greater than the second thickness.

In some embodiments, the first surface has a plurality of parabolic depressions that act to direct the first portion of the flowed cleaning gas impinging thereon in the first trajectory toward the first end of the process chamber and a plurality of parabolic ridges that act to direct the second portion of the flowed cleaning gas impinging thereon in the second trajectory toward the second end of the process chamber.

In yet further embodiments, the cleaning gas comprises a nitrogen trifluoride.

In some embodiments, the applied process comprises an atomic layer deposition process.

In some further embodiments, a process chamber is provided for depositing a material on one or more semiconductor wafers. The process chamber includes: a plurality of mounting structures, each mounting structure arranged to selectively receive atop thereof a semiconductor wafer; one or more showerheads from which a process gas is introduced into the process chamber for forming a thin film of material on one or more semiconductor wafers placed upon the plurality of mounting structures; a port from which a cleaning gas is flowed into the process chamber; and a deflector having a central hub, an outer periphery and a first surface extending between the central hub and outer periphery, the first surface facing the port, and along a bisecting cross-section of the deflector the first surface is defined by at least two arcs having an inflection point therebetween, the at least two arcs including a first arc which is concave in a first direction between the central hub and the inflection point and a second arc which is concave in a second direction between the inflection point and the outer periphery, the second direction being opposite the first direction.

In still further embodiments, the process chamber is a silicon carbon oxide (SiCO) deposition chamber.

In yet additional embodiments, the process chamber further includes a spindle including a plurality of end effectors for manipulating the semiconductor wafers, and wherein the deflector forms an index plate of the spindle.

In some additional embodiments, the first arc has a radius of curvature in a range of between greater than or equal to 20 mm and less than or equal to 500 mm, and the second arc has a radius of curvature in a range of between greater than or equal to 10 mm and less than or equal to 300 mm.

In some embodiments, the deflector has a second surface opposite the first surface, such that a thickness of the deflector is given by a distance between first and second surfaces, the deflector having a first thickness at the central hub, a second thickness at a localized minimum of the first arc and a third thickness at a localized maximum of the second arc, the first thickness being greater than the third thickness and the third thickness being greater than the second thickness.

In some embodiments, the deflector is supported within the process chamber such that, at the outer periphery of the deflector, the second surface of the deflector is within a range of between greater than or equal to 0 mm and less than or equal to 30 mm from a floor of the process chamber.

In some further embodiments, the plurality of mounting structures includes at least four mounting structures arranged on a base of the process chamber and the deflector is also arranged on the base of the process chamber amid the at least four mounting structures.

In still further embodiments, a common vertical axis extends through both the central hub of the deflector and the port.

In yet further embodiments, there is provided a cleaning gas deflector which deflects cleaning gas flowed into a semiconductor processing chamber having housed therein a plurality of mounting structures upon which one or more semiconductor wafers are selectively placed for the formation of a layer a material thereon. The cleaning gas deflector includes: a central hub through which a central vertical axis extends; an outer periphery; and a first surface extending between the central hub and the outer periphery, wherein the first surface has: (i) one or more depressions therein, each depression defined at least in part by a first parabolic arc which is concave up, and (ii) one or more ridges therein, each ridge defined at least in part by a second parabolic arc which is concave down.

In still one more embodiment, the first and second parabolic arcs define the first surface along a bisecting cross-section of the deflector, the first arc extending from the central hub to an inflection point, and the second arc extending from the inflection point to the outer periphery, wherein a ratio of a first distance to a second distance is in a range of between great than or equal to 1 and less than or equal to 5, where the first distance is the distance, measured along a direction normal to the central vertical axis, between the central hub and the inflection point and the second distance, likewise measured along the direction normal to the central vertical axis, is the distance between the inflection point and the outer periphery, the second distance being less than or equal to the first distance.

In still further embodiments, the first parabolic arc has a radius of curvature in a range of between greater than or equal to 20 mm and less than or equal to 500 mm, and the second parabolic arc has a radius of curvature in a range of between greater than or equal to 10 mm and less than or equal to 300 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating semiconductor devices, said method comprising:
    loading one or more semiconductor wafers into a plurality of stations provided within a process chamber;
    applying a process to the semiconductor wafers which deposits a silicon carbon oxide (SiCO) on the one or more semiconductor wafers within the process chamber; and
    cleaning the process chamber;
    wherein said cleaning comprises:
        flowing a cleaning gas into the process chamber toward a deflector arranged in the process chamber, said deflector having a first surface upon which the flowed cleaning gas impinges, said first surface directing a first portion of the flowed cleaning gas impinging thereon in a first trajectory toward a first end of the process chamber and directing a second portion of the flowed cleaning gas impinging thereon in a second trajectory toward a second end of the process chamber, said second end being opposite the first end.

2. The method of claim 1, wherein said deflector has a central hub and an outer periphery between which the first surface extends, and along a bisecting cross-section of the deflector the first surface is defined by at least two arcs having an inflection point therebetween, said at least two arcs including a first arc which is concave in a first direction between the central hub and the inflection point and a second arc which is concave in a second direction between the inflection point and the outer periphery, said second direction being opposite the first direction.

3. The method of claim 2, wherein the first and second arcs are parabolic.

4. The method of claim 2, wherein the first arc has a radius of curvature in a range of between greater than or equal to 20 mm and less than or equal to 500 mm, and the second arc has a radius of curvature in a range of between greater than or equal to 10 mm and less than or equal to 300 mm.

5. The method of claim 2, wherein the deflector has a second surface opposite the first surface, such that a thickness of the deflector is given by a distance between the first and second surfaces, said deflector having a first thickness at the central hub, a second thickness at a localized minimum of the first arc and a third thickness at a localized maximum of the second arc, said first thickness being greater than the third thickness and said third thickness being greater than the second thickness.

6. The method of claim 1, wherein the first surface has a plurality of parabolic depressions that act to direct the first portion of the flowed cleaning gas impinging thereon in the first trajectory toward the first end of the process chamber and a plurality of parabolic ridges that act to direct the second portion of the flowed cleaning gas impinging thereon in the second trajectory toward the second end of the process chamber.

7. The method of claim 1, wherein the cleaning gas comprises a nitrogen trifluoride.

8. The method of claim 1, wherein the applied process comprises an atomic layer deposition process.

9. A method for depositing a material on one or more semiconductor wafers, said method comprising:
    arranging a plurality of mounting structures to selectively receive atop thereof a semiconductor wafer;
    introducing, through one or more showerheads, a process gas into a process chamber for forming a film of material on one or more semiconductor wafers placed upon the plurality of mounting structures;
    flowing a cleaning gas from a port into the process chamber;
    wherein the process chamber includes a deflector having a central hub, an outer periphery and a first surface extending between the central hub and outer periphery, said first surface facing the port, and along a bisecting cross-section of the deflector the first surface is defined by at least two arcs having an inflection point therebetween, said at least two arcs including a first arc which is concave in a first direction between the central hub and the inflection point and a second arc which is concave in a second direction between the inflection point and the outer periphery, said second direction being opposite the first direction.

10. The method of claim 9, wherein the process chamber is a silicon carbon oxide (SiCO) deposition chamber.

11. The method of claim 9, wherein the process chamber further comprises:
    a spindle including a plurality of end effectors for manipulating the semiconductor wafers;
    wherein the deflector forms an index plate of the spindle.

12. The method of claim 9, wherein the first arc has a radius of curvature in a range of between greater than or equal to 20 mm and less than or equal to 500 mm, and the second arc has a radius of curvature in a range of between greater than or equal to 10 mm and less than or equal to 300 mm.

13. The method of claim 9, wherein the deflector has a second surface opposite the first surface, such that a thickness of the deflector is given by a distance between first and second surfaces, said deflector having a first thickness at the central hub, a second thickness at a localized minimum of the first arc and a third thickness at a localized maximum of the second arc, said first thickness being greater than the third thickness and said third thickness being greater than the second thickness.

14. The method of claim 13, wherein the deflector is supported within the process chamber such that, at the outer periphery of the deflector, the second surface of the deflector is within a range of between greater than or equal to 0 mm and less than or equal to 30 mm from a floor of the process chamber.

15. The method of claim 9, wherein the plurality of mounting structures includes at least four mounting structures arranged on a base of the process chamber and the deflector is also arranged on the base of the process chamber amid the at least four mounting structures.

16. The method of claim 9, wherein a common vertical axis extends through both the central hub of the deflector and the port.

17. A method of cleaning a semiconductor processing chamber, the method comprising:
- with a cleaning gas deflector, deflecting cleaning gas flowed into a semiconductor processing chamber having housed therein a plurality of mounting structures upon which one or more semiconductor wafers are selectively placed for the formation of a layer a material thereon,
- wherein said cleaning gas deflector comprises:
  - a central hub through which a central vertical axis extends;
  - an outer periphery; and
  - a first surface extending between the central hub and the outer periphery;
  - wherein the first surface has: (i) one or more depressions therein, each depression defined at least in part by a first parabolic arc which is concave up, and (ii) one or more ridges therein, each ridge defined at least in part by a second parabolic arc which is concave down.

18. The method gas deflector of claim 17, wherein the first and second parabolic arcs define the first surface along a bisecting cross-section of the deflector, said first arc extending from the central hub to an inflection point, and the second arc extending from the inflection point to the outer periphery, wherein a ratio of a first distance to a second distance is in a range of between great than or equal to 1 and less than or equal to 5, where the first distance is the distance, measured along a direction normal to the central vertical axis, between the central hub and the inflection point and the second distance, likewise measured along the direction normal to the central vertical axis, is the distance between the inflection point and the outer periphery, said second distance being less than or equal to the first distance.

19. The method of claim 17, wherein the first parabolic arc has a radius of curvature in a range of between greater than or equal to 20 mm and less than or equal to 500 mm, and the second parabolic arc has a radius of curvature in a range of between greater than or equal to 10 mm and less than or equal to 300 mm.

20. The method of claim 17, wherein the cleaning gas comprises a nitrogen trifluoride.

* * * * *